US008972248B2

(12) United States Patent
Otani et al.

(10) Patent No.: US 8,972,248 B2
(45) Date of Patent: Mar. 3, 2015

(54) BAND BROADENING APPARATUS AND METHOD

(75) Inventors: Takeshi Otani, Kawasaki (JP); Taro Togawa, Kawasaki (JP); Masanao Suzuki, Yokohama (JP); Shusaku Ito, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/616,917

(22) Filed: Sep. 14, 2012

(65) Prior Publication Data

US 2013/0013300 A1 Jan. 10, 2013

Related U.S. Application Data

(63) Continuation of application No. PCT/JP2010/055962, filed on Mar. 31, 2010.

(51) Int. Cl.

| | |
|---|---|
| ***G10L 21/00*** | (2013.01) |
| ***G10L 21/038*** | (2013.01) |
| *G10L 13/00* | (2006.01) |
| *H03G 5/00* | (2006.01) |
| *H04R 29/00* | (2006.01) |
| *H03G 3/00* | (2006.01) |
| *H03G 9/00* | (2006.01) |
| *H04B 1/00* | (2006.01) |
| *G10L 25/90* | (2013.01) |

(52) U.S. Cl.
CPC ............... *G10L 21/038* (2013.01); *G10L 25/90* (2013.01)
USPC ........... 704/205; 704/500; 704/501; 704/211; 704/258; 704/219; 381/98; 381/58; 381/61; 381/102; 381/119

(58) Field of Classification Search
USPC ................. 704/205, 500, 211, 258, 219, 501; 381/1, 80, 98, 58, 102, 119, 61; 455/39; 601/2
See application file for complete search history.

(56) References Cited

U.S. PATENT DOCUMENTS 7,184,961 B2 * 2/2007 Sato .............................. 704/501
7,991,171 B1 * 8/2011 Snow ............................ 381/102

(Continued)

FOREIGN PATENT DOCUMENTS

JP 9-55778 2/1997
JP 9-258787 10/1997

(Continued)

OTHER PUBLICATIONS

Supplementary European Search Report dated Nov. 29, 2012, from corresponding European Application No. 10848958.4.

(Continued)

*Primary Examiner* — Paras D Shah
*Assistant Examiner* — Neeraj Sharma
(74) *Attorney, Agent, or Firm* — Katten Muchin Rosenman LLP

(57) ABSTRACT

A band broadening apparatus includes a processor configured to analyze a fundamental frequency based on an input signal bandlimited to a first band, generate a signal that includes a second band different from the first band based on the input signal, control a frequency response of the second band based on the fundamental frequency, reflect the frequency response of the second band on the signal that includes the second band and generate a frequency-response-adjusted signal that includes the second band, and synthesize the input signal and the frequency-response-adjusted signal.

8 Claims, 15 Drawing Sheets

(56) References Cited

U.S. PATENT DOCUMENTS

| | | | | |
|---|---|---|---|---|
| 8,036,394 | B1 * | 10/2011 | Yonemoto et al. | 381/61 |
| 8,069,036 | B2 * | 11/2011 | Pauws et al. | 704/205 |
| 8,254,589 | B2 * | 8/2012 | Mitsuhata | 381/71.11 |
| 8,600,067 | B2 * | 12/2013 | Usher et al. | 381/58 |
| 2002/0009204 | A1 * | 1/2002 | Matsumura | 381/98 |
| 2002/0016698 | A1 | 2/2002 | Tokuda | |
| 2003/0059066 | A1 * | 3/2003 | Kohyama et al. | 381/119 |
| 2006/0251261 | A1 * | 11/2006 | Christoph | 381/1 |
| 2008/0027733 | A1 | 1/2008 | Oshikiri et al. | |
| 2008/0126082 | A1 | 5/2008 | Ehara et al. | |
| 2008/0270125 | A1 * | 10/2008 | Choo et al. | 704/205 |
| 2009/0144062 | A1 * | 6/2009 | Ramabadran et al. | 704/500 |
| 2009/0176449 | A1 | 7/2009 | Tashiro | |
| 2009/0240489 | A1 | 9/2009 | Aoyagi | |
| 2010/0014576 | A1 | 1/2010 | Komamura | |
| 2010/0057476 | A1 | 3/2010 | Sudo et al. | |
| 2010/0121646 | A1 * | 5/2010 | Ragot et al. | 704/500 |
| 2010/0161323 | A1 * | 6/2010 | Oshikiri | 704/207 |
| 2010/0232619 | A1 * | 9/2010 | Uhle et al. | 381/80 |
| 2011/0152729 | A1 * | 6/2011 | Oohashi et al. | 601/2 |

FOREIGN PATENT DOCUMENTS

| | | |
|---|---|---|
| JP | 2002-82685 | 3/2002 |
| JP | 2009-116245 | 5/2009 |
| JP | 2009-229519 | 10/2009 |
| JP | 2009-244650 | 10/2009 |
| WO | 02/056295 | 7/2002 |
| WO | 2005/111568 | 11/2005 |
| WO | 2008/015732 | 2/2008 |

OTHER PUBLICATIONS

International Search Report dated May 18, 2010, from corresponding International Application No. PCT/JP2010/055962.
International Preliminary Report on Patentability and Written Opinion of the International Searching Authority dated Nov. 1, 2012, from corresponding International Application No. PCT/JP2010/055962.
Communication pursuant to Article 94(3) EPC dated Aug. 2, 2013, from corresponding European Application No. 10 848 958.4-1910.
Japanese Notice of Rejection dated Dec. 3, 2013 from corresponsing Japanese Application No. 2012-507998.

* cited by examiner

BAND BROADENING APPARATUS AND METHOD

CROSS REFERENCE TO RELATED APPLICATIONS

This application is a continuation application of International Application PCT/JP2010/055962, filed on Mar. 31, 2010 and designating the U.S., the entire contents of which are incorporated herein by reference.

FIELD

The embodiments discussed herein are related to a band broadening apparatus and method.

BACKGROUND

In a telephone call system such as a landline telephone system or a mobile telephone system, usually bandlimited audio signals are transmitted or received. For the purpose of enhancing the sound quality, a technique is known that extends the bandwidth of bandlimited audio signals. For example, a technique is known where the folding of a digital signal is bandlimited with a low pass filter that is switched between a low cutoff frequency for a voiced interval and a high cutoff frequency for an unvoiced interval, thereby broadening the bandwidth to a higher frequency within the unvoiced interval. Another example is where a waveform of a sound source is generated from a narrow band signal, a low frequency signal obtained through a low pass filter whose cutoff frequency is the lowest frequency of a narrow band, a period of the narrow band signal, and the amplitude of the narrow band signal; and an audio signal having a broadband width is obtained by the summation of a high frequency signal obtained through a high pass filter and a high frequency component signal of an unvoiced sound. Further another example is where a fundamental frequency of a narrow band signal is extracted; a linear predictive residual is obtained from the linear predictive analysis of the narrow band signal; the linear predictive residual is shifted toward the frequency axis by the amount of an integer multiple of the fundamental frequency; a band-extended signal is obtained by the linear predictive synthesis; and a broadband audio signal is obtained by adding the narrow band signal and the band-extended signal.

For examples of the technologies above, refer to Japanese Laid-open Patent Publication Nos. 2002-82685, H9-258787, and H9-55778.

FIGS. 1 and 2 are diagrams depicting one example of a spectrum of an audio signal (spectrum of broadband sound) where a high frequency component has been ideally estimated from a low frequency component of a bandlimited audio signal. FIG. 1 depicts a spectrum of broadband sound when the fundamental frequency is high (345 Hz) and FIG. 2 depicts a case of a low fundamental frequency (125 Hz). The average of the fundamental frequency of a male voice is about 100 Hz and of a female voice 200 Hz or more. The inventors of the present invention have found a characteristic of broadband sound in that when the fundamental frequency is high, the difference of volumes (difference of power) between a high frequency region and a low frequency region is small and when the fundamental frequency is low, the difference of volumes is large (see FIGS. 1 and 2).

However, the conventional techniques do not consider the characteristic depicted in FIGS. 1 and 2. According to the conventional techniques, the high frequency component is generated in a single way irrespective of fundamental frequency. This causes a problem in that when the high frequency component having as large volume as the low frequency component is generated under a low fundamental frequency, the volume of the high frequency component becomes too large compared to an ideal volume and the sound quality is degraded. When the high frequency component has a smaller volume than the low frequency component under a high fundamental frequency, the volume of the high frequency component becomes too small compared to an ideal volume and cannot obtain sufficient band broadening effect. In other words, high quality sound cannot be produced.

SUMMARY

According to an aspect of an embodiment, a band broadening apparatus includes a processor configured to analyze a fundamental frequency based on an input signal bandlimited to a first band, generate a signal that includes a second band different from the first band based on the input signal, control a frequency response of the second band based on the fundamental frequency, reflect the frequency response of the second band on the signal that includes the second band and generate a frequency-response-adjusted signal that includes the second band, and synthesize the input signal and the frequency-response-adjusted signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Preferred embodiments of a band broadening apparatus and method will be explained with reference to the accompanying drawings. The band broadening apparatus and method provides high quality sound by controlling the frequency response of a band such that the power difference between an input signal and a band-extended signal becomes smaller when the fundamental frequency is high than when the fundamental frequency is low and. Embodiments do not limit the invention in any way.

Figure 3:
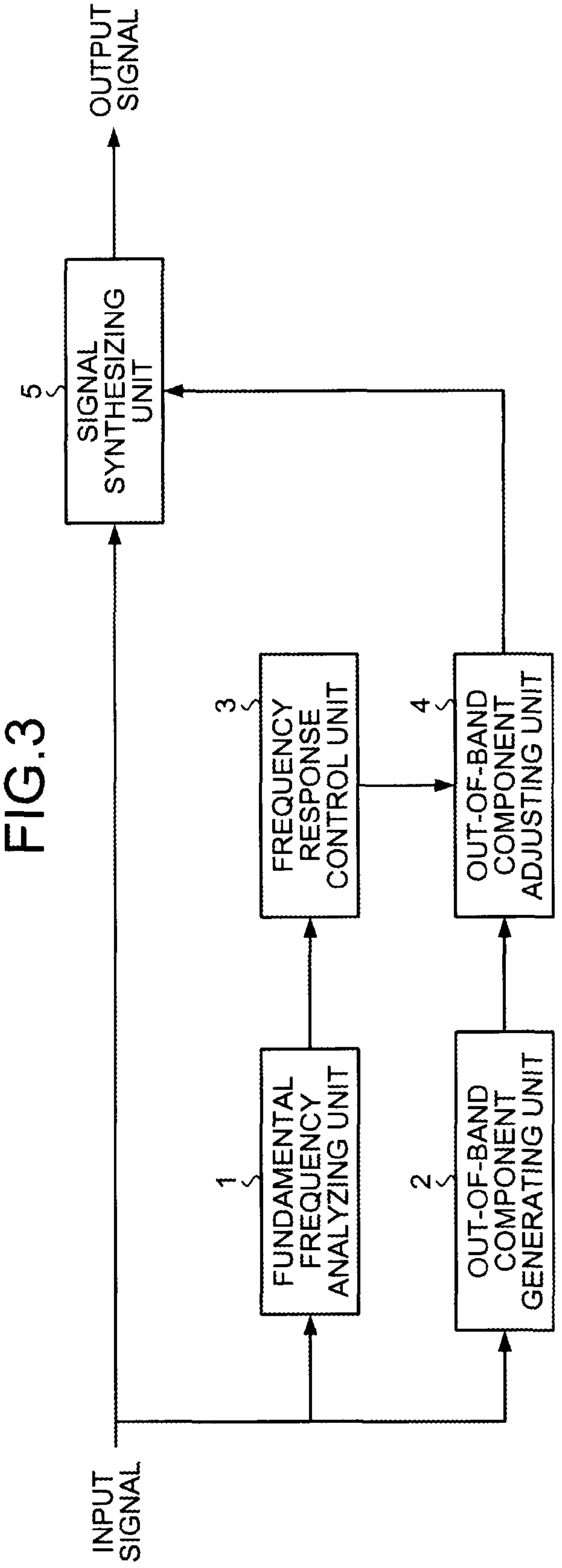
FIG. 3 is a block diagram depicting a band broadening apparatus according to a first example.

FIG. 3 is a block diagram depicting a band broadening apparatus according to a first example. The band broadening apparatus includes a fundamental frequency analyzing unit 1, an out-of-band component generating unit 2, a frequency response control unit 3, an out-of-band component adjusting unit 4 and a signal synthesizing unit 5. Each unit is realized by a processor executing a band broadening program. The band broadening apparatus receives an input signal that is band-limited to the first band. The fundamental frequency analyzing unit 1 analyzes the frequency of the fundamental frequency based on the input signal. The out-of-band component generating unit 2 generates a signal that includes the second band based on the input signal. The second band is a band outside of the first band and may be a higher frequency band or lower frequency band compared with the first band.

The frequency response control unit 3 controls the frequency response of the second band such that the power difference between the input signal and the signal that includes the second band becomes smaller when the fundamental frequency is high than when the fundamental frequency is low. The out-of-band component adjusting unit 4 generates a signal that includes the second band with the frequency response adjusted by reflecting the frequency response of the second band controlled by the frequency response control unit 3 on the signal having the second band generated by the out-of-band component generating unit 2. The signal synthesizing unit 5 synthesizes the input signal and the signal generated by the out-of-band component adjusting unit 4. A signal generated by the signal synthesizing unit 5 is output as an output signal of the band broadening apparatus. The output signal is a broadband signal that includes the first band and the second band.

Figure 4:
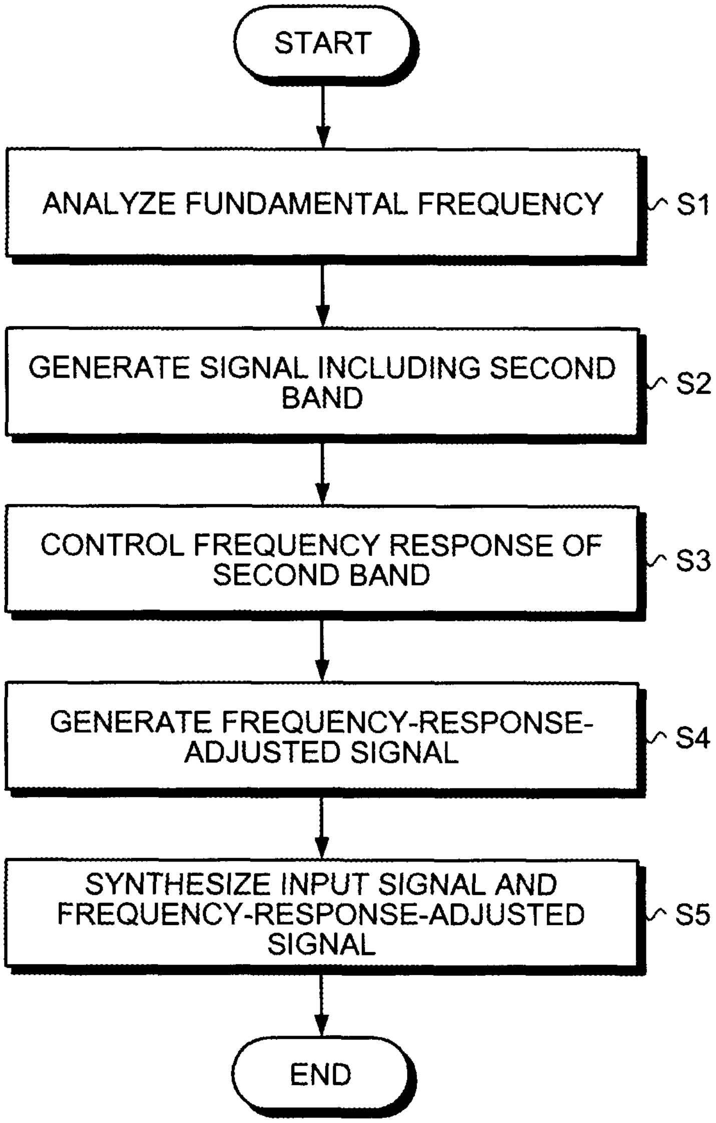
FIG. 4 is a flowchart of a band broadening method according to the first example.

FIG. 4 is a flowchart depicting a band broadening method according to the first example. As depicted in FIG. 4, when the band broadening process is started, the band broadening apparatus analyzes, by means of the fundamental frequency analyzing unit 1, the frequency of the fundamental frequency based on the input signal (step S1). The band broadening apparatus generates, by means of the out-of-band component generating unit 2, a signal including the second band based on the input signal (step S2). The order of steps S1 and S2 may be switched.

The band broadening apparatus controls, by means of the frequency response control unit 3, the frequency response of the second band such that the power difference between the input signal and the signal including the second band becomes smaller when the fundamental frequency is high than when the fundamental frequency is low (step 3). The band broadening apparatus generates, by means of the out-of-band component adjusting unit 4, a signal including the second band with the frequency response adjusted by reflecting the frequency response of the second band on the signal having the second band (step 4). The band broadening apparatus synthesizes, by means of the signal synthesizing unit 5, the input signal and the signal including the second band with the frequency response adjusted (step S5), and terminates the process.

Figure 1:
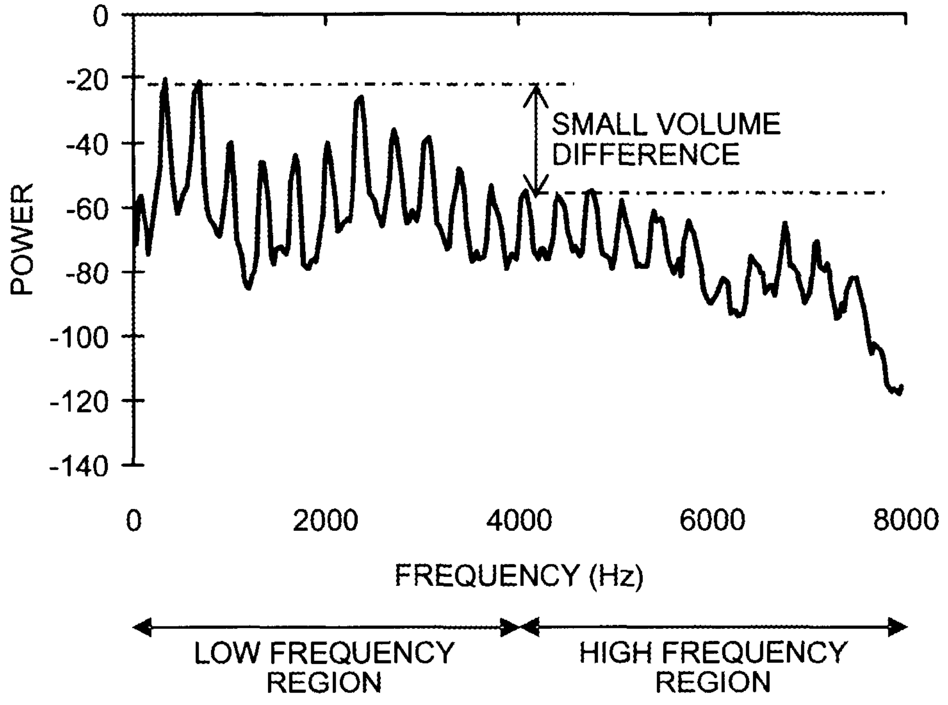
FIG. 1 is a diagram depicting one example of an ideal spectrum of broadband sound when the fundamental frequency is high.
Figure 2:
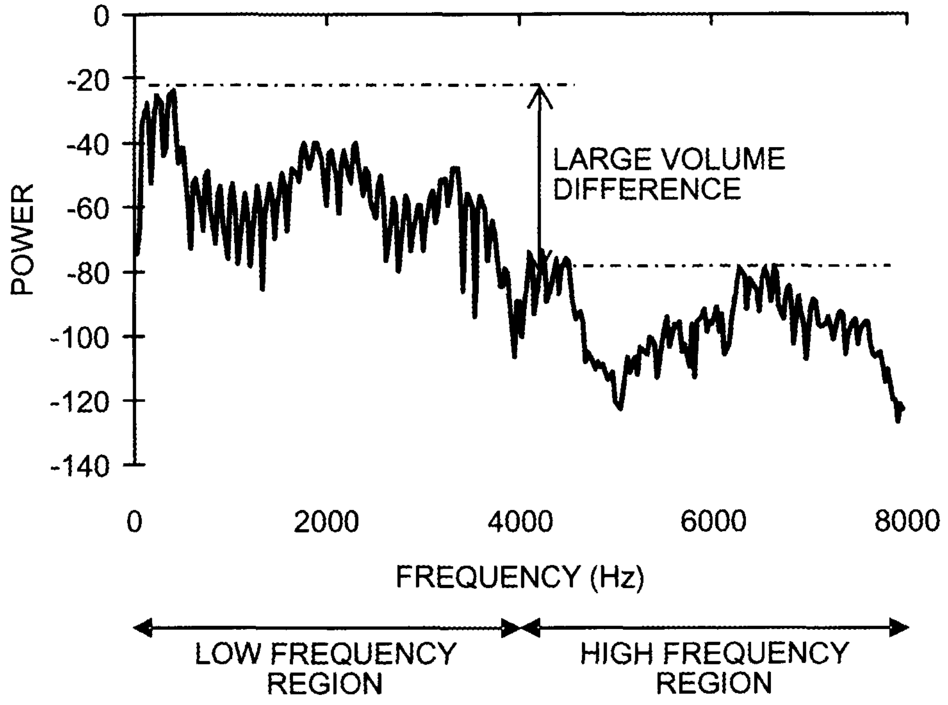
FIG. 2 is a diagram depicting one example of an ideal spectrum of broadband sound when the fundamental frequency is low.

According to the first example, when the fundamental frequency of the input signal is high, the power difference (volume difference) between the input signal and the band-extended signal including the second band becomes smaller and thus an approximately ideal broadband sound spectrum as depicted in FIG. 1 is obtained. Further, when the fundamental frequency of the input signal is low, the power difference (volume difference) between the input signal and the band-extended signal including the second band becomes larger and thus an approximately ideal broadband sound spectrum depicted in FIG. 2 is obtained. In other words, the control of the frequency response of the second band according to the fundamental frequency of the input signal enables the provision of the high quality sound.

The second example explains the application of the band broadening apparatus into a cellular phone. The application of the band broadening apparatus is not limited to a cellular phone but the band broadening apparatus is applicable to an apparatus for the a voice communication such as a telephone in the landline telephone system. In the second example, a high frequency region is generated from a bandlimited input signal, and the high frequency region and the input signal are synthesized to extend the band. The band of the input signal corresponds to the first band and the band of the high frequency component corresponds to the second band.

Figure 5:
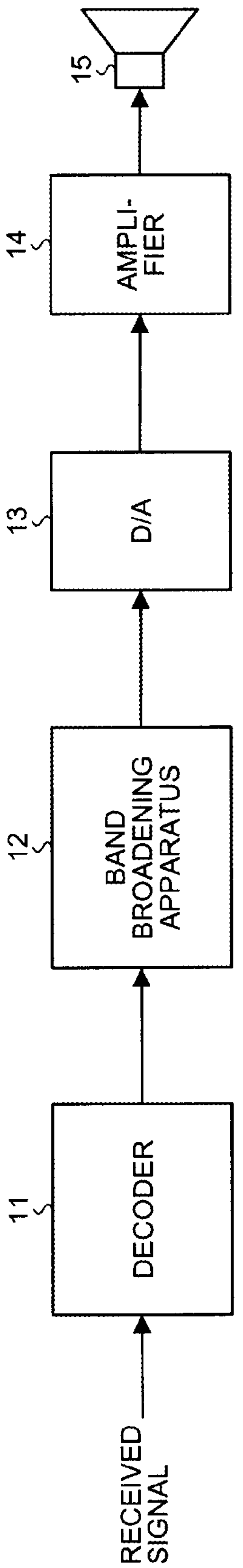
FIG. 5 is a block diagram depicting a cellular phone to which the band broadening apparatus according to a second example is applied.

FIG. 5 is a block diagram depicting a cellular phone to which the band broadening apparatus is applied. The cellular phone includes a decoder 11, a band broadening apparatus 12, a digital-analog converter 13, an amplifier 14, and a speaker 15. FIG. 5 depicts elements that broaden the band of a received sound signal and play the sound, and omits elements that convert sound into transmission data and do not relate to the sound processing such as communication, display, and operation.

The decoder 11 demodulates and decodes a received signal, and outputs a signal having, for example, the bandwidth of 8 kHz. The band broadening apparatus 12 extends the bandwidth of an output signal from the decoder 11 and outputs a signal with the bandwidth of, for example, 16 kHz. The digital-analog converter 13 converts an output signal from the band broadening apparatus 12 to an analog signal. The amplifier 14 amplifies an output signal from the digital-analog converter 13. The speaker 15 converts an output signal from the digital-analog converter 13 to sound and outputs the sound.

Figure 6:
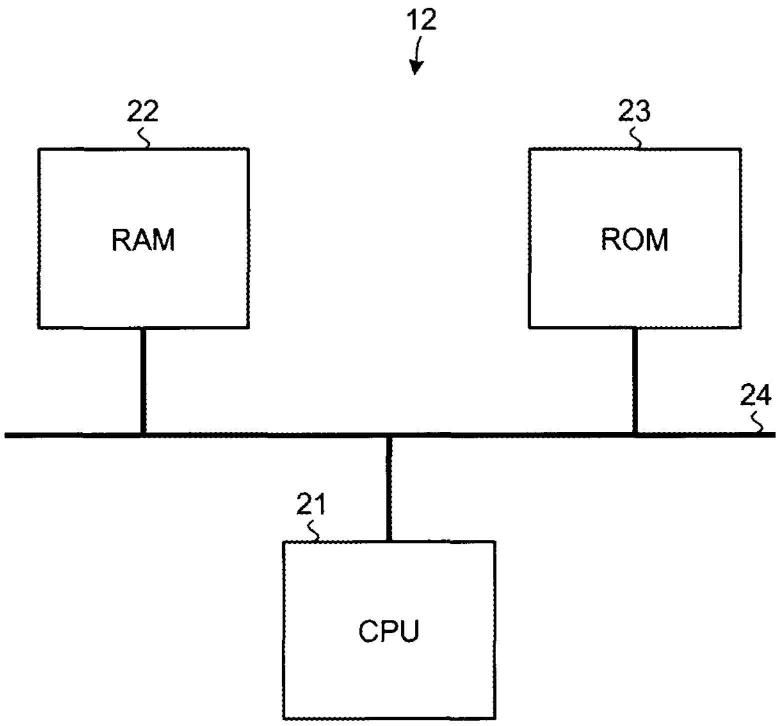
FIG. 6 is a block diagram depicting a hardware configuration of the band broadening apparatus according to the second example.

FIG. 6 is a block diagram depicting a hardware configuration of the band broadening apparatus according to the second example. The band broadening apparatus 12 includes a central processing unit (CPU) 21, a random access memory (RAM) 22, and a read-only memory 23, respectively connected by a bus 24.

The ROM 23 stores therein a band broadening program that causes the CPU 21 to perform a band broadening method that will be explained later. The RAM 22 is used as a work area of the CPU 21. The RAM 22 stores data, output signals from the decoder 11. The CPU 21 loads into the RAM 22, the band broadening process program read from the ROM 23 and implements the band broadening process.

Figure 7:
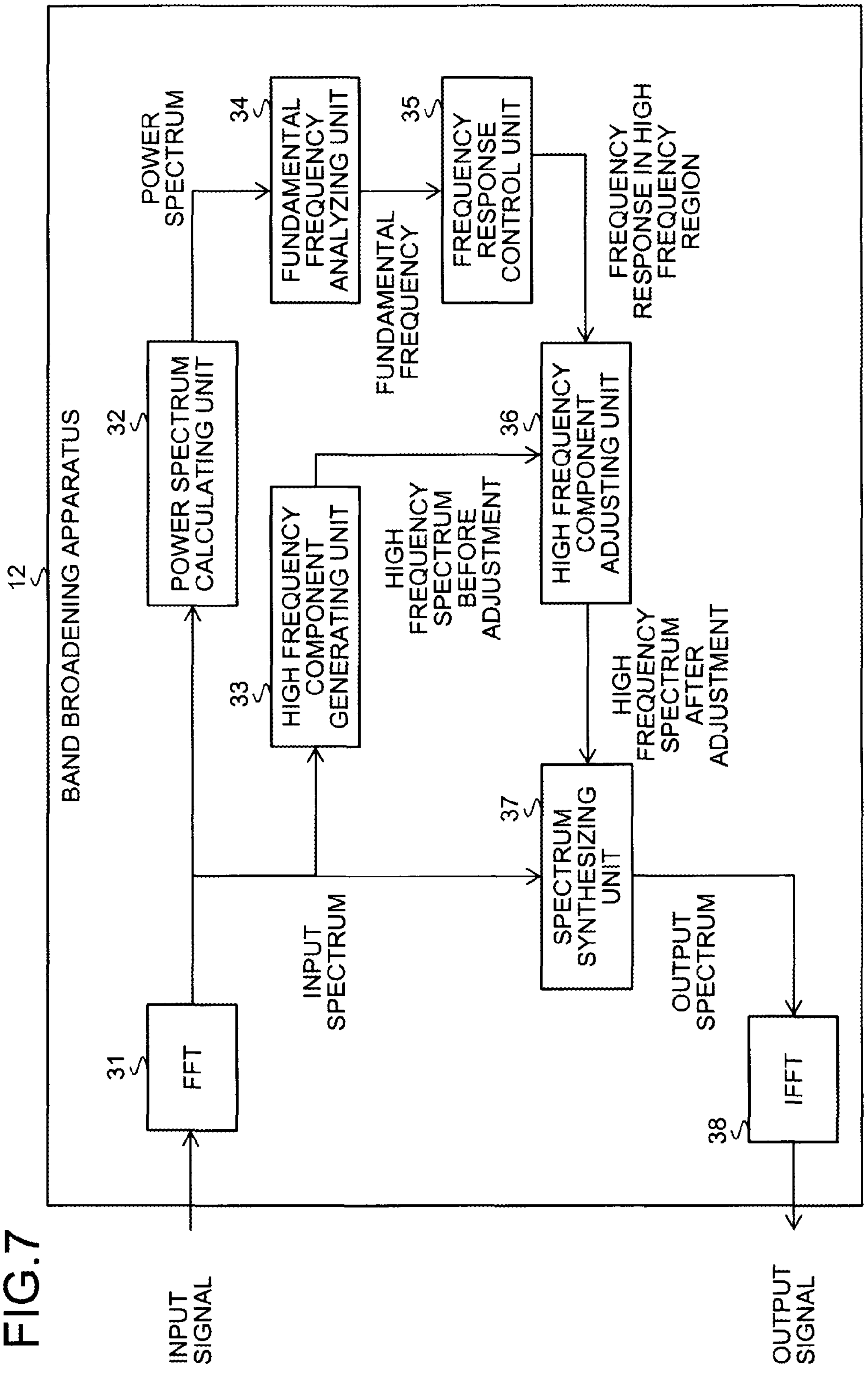
FIG. 7 is a block diagram depicting a functional configuration of the band broadening apparatus according to the second example.

FIG. 7 is a block diagram depicting a functional configuration of the band broadening apparatus according to the second example. The band broadening apparatus 12 includes a fast Fourier transformation (FFT) unit 31, a power spectrum calculating unit 32, and a high frequency component generating unit (out-of-band component generating unit) 33. The fast Fourier transformation unit 31 performs a fast Fourier transformation process (for example, 256 points) for an input signal x(n) and works out an input spectrum X(f) where n is a sample number and f is a frequency number.

Figure 8:
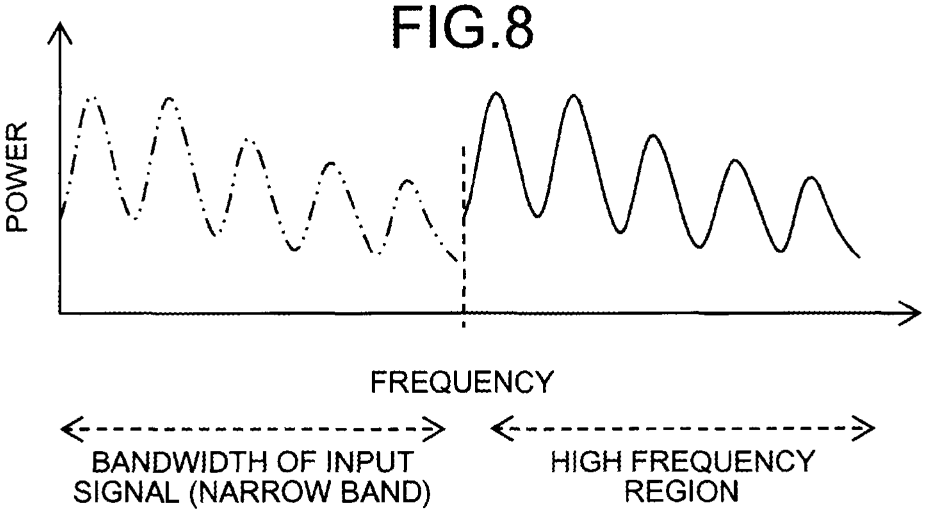
FIG. 8 is a diagram depicting a high frequency component created by a high frequency component generating unit.

The power spectrum calculating unit 32 works out a power spectrum S(f) from the input spectrum X(f) according to Equation (1) below. The high frequency component generating unit 33 shifts, according to Equation (2), the input spectrum X(f) over the frequency numbers 64 to 127 toward the high frequency region of the frequency number 128 and the subsequent frequency numbers, and generates a high frequency spectrum $X_h(f)$. FIG. 8 is a diagram depicting a high frequency component created by the high frequency component generating unit. As depicted in FIG, 8, the high frequency component generating unit 33 only shifts an input signal (expressed by a two-dot line) toward a high frequency region. At present, the attenuation profile of a high frequency component (expressed by a solid line) is not adjusted.

$$S(f)=10\log_{10}(|X(f)|^2) \quad (1)$$

$$X_h(f+64)=X(f)\ f=64 \text{ to } 127 \quad (2)$$

The band broadening apparatus 12 further includes a fundamental frequency analyzing unit 34, a frequency response control unit 35, and a high frequency component adjusting unit (out-of-band component adjusting unit) 36. The fundamental frequency analyzing unit 34 works out the fundamental frequency $f_0$ from the autocorrelation of the power spectrum S(f) according to, for example, Equation (3) below.

$$f_0 = \underset{g=1}{\overset{32}{\operatorname{argmax}}}\left(\frac{\sqrt{\sum_{f=0}^{64} S(f)\cdot S(f+g)}}{\sqrt{\sum_{f=0}^{64} S(f)^2}\cdot\sqrt{\sum_{f=0}^{64} S(f+g)^2}}\right) \quad (3)$$

Figure 9:
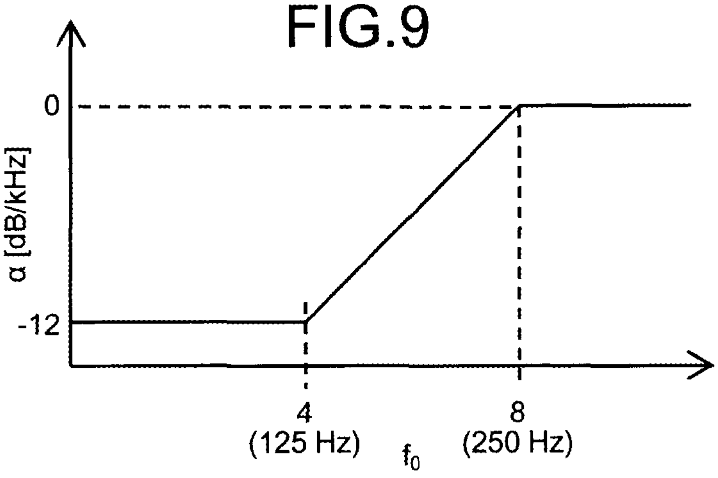
FIG. 9 is a graph of an equation according to which a gradient $\alpha$ is obtained from a fundamental frequency f0.

The frequency response control unit 35 works out a gradient α of the attenuation profile in the high frequency region based on the fundamental frequency $f_0$ according to, for example, an equation expressed by a graph in FIG. 9. FIG. 9 is a graph of an equation according to which the gradient α is obtained from the fundamental frequency $f_0$. In FIG. 9, the frequency number 4 corresponds to 125 Hz, generally the fundamental frequency (about 150 Hz) of men. The frequency number 8 corresponds to 250 Hz, generally the fundamental frequency (about 300 Hz) of women. The fundamental frequency $f_0$ varies in and near the range between 125 Hz and 250 Hz.

In FIG. 9, when the fundamental frequency $f_0$ is in the range below the frequency number 4, the gradient α is at a constant value of −12 dB/kHz. When the fundamental frequency $f_0$ is in the range between the frequency number 4 and 8, the gradient α increases at a constant rate and comes to 0 dB/kHz. When the fundamental frequency $f_0$ is in the range above the frequency number 8, the gradient α is at a constant value of 0 dB/kHz. The specific numerical values on the horizontal and vertical axes in FIG. 9 are mere examples. The frequency response control unit 35 works out the attenuation profile G(f) in the high frequency region from the gradient α of the attenuation profile in the high frequency region according to Equation (4) below. When 0 is substituted into f in Equation (4), the attenuation profile G(f) at the frequency number 128 becomes 0 dB. This means that an amount of the amplification at the boundary between the band of the input signal and the band of the high frequency component is 0 dB.

$$G(128+f) = \alpha/32\cdot f \ \text{[dB]} \quad f = 0 \text{ to } 127 \quad (4)$$
$$= 10^{(\alpha/32\cdot f/20)}$$

Figure 10:
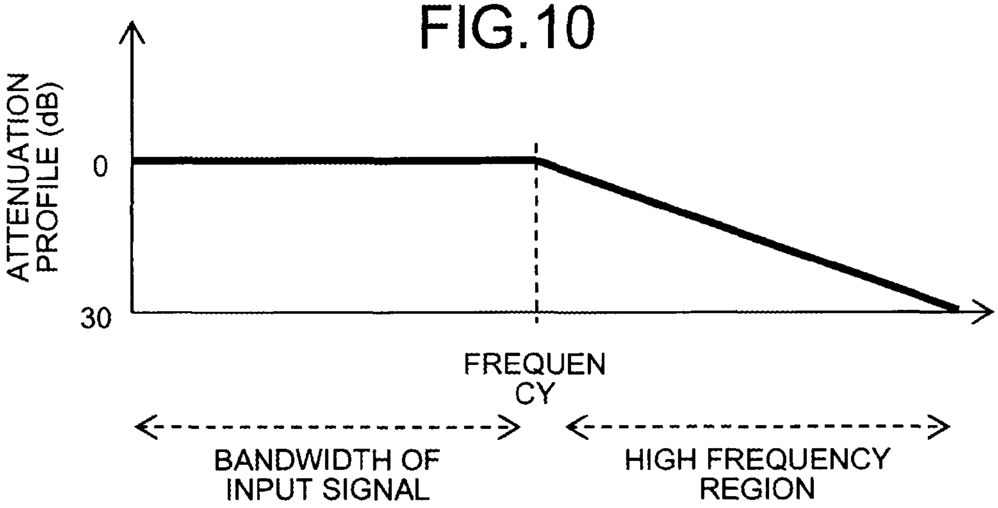
FIG. 10 is a graph depicting a frequency response controlled by a frequency response control unit.

FIG. 10 is a graph depicting a frequency response controlled by the frequency response control unit. In FIG. 10, the amplification in the band of the input signal is 0 dB. The amplification is 0 dB at the boundary between the band of the input signal and the band of the high frequency component and is less than 0 dB in the higher frequency region. In the high frequency region, the attenuation becomes larger at the rate αas the frequency becomes higher. In the example of FIG. 10, the attenuation profile of the high frequency region is expressed by a function proportional to the frequency.

When the gradient α becomes smaller as the fundamental frequency $f_0$ becomes higher as explained in FIG. 9, the line over the high frequency region in FIG. 10 becomes shallower. On the other hand, when the gradient α becomes larger as the fundamental frequency $f_0$ becomes lower, the line over the high frequency region in FIG. 10 becomes steeper. Therefore, in the high frequency region, the attenuation under a low fundamental frequency is larger than that under a high fundamental frequency. Numerical values on the vertical axis in FIG. 10 are mere examples.

The high frequency component adjusting unit 36 multiplies the high frequency spectrum $X_h(f)$ by the attenuation profile G(f) according to Equation (5) and generates the high frequency spectrum $X_h'$ (f) with the frequency response adjusted.

$$X_h'(f)=X_h(f)\cdot G(f) \quad (5)$$

The band broadening apparatus 12 further includes a spectrum synthesizing unit (signal synthesizing unit) 37 and an inverse FFT unit 38. The spectrum synthesizing unit 37 synthesizes the input spectrum output from the FFT unit 31 and the frequency-response-adjusted high frequency spectrum $X_h'$ (f) output from the high frequency component adjusting unit 36, and generates an output spectrum Y(f). The output spectrum Y(f) equals to the input spectrum X(f) over the range between the frequency number 0 and 127 and equals to the frequency-response-adjusted high frequency spectrum $X_h'$ (f) over the range between the frequency number 128 and 255 as expressed by Equation (6) below.

$$Y(f)=X(f)\ f=0 \text{ to } 127$$

$$Y(f)=X_h'(f)\ f=128 \text{ to } 255 \quad (6)$$

Figure 11:
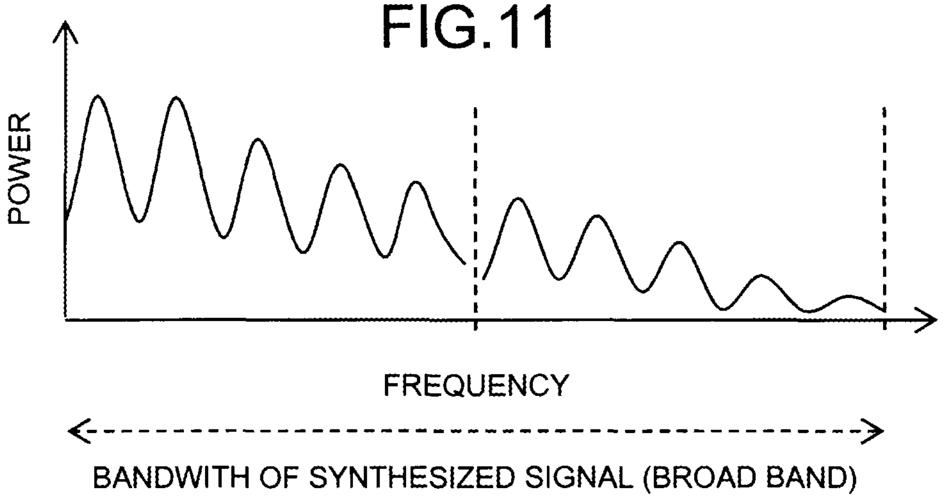
FIG. 11 is a diagram depicting an output spectrum synthesized by the spectrum synthesizing unit.

FIG. 11 is a diagram depicting an output spectrum synthesized by the spectrum synthesizing unit. The spectrum in the high frequency region is not a mere translation of the spectrum in the band of the input signal toward the high frequency region but is a spectrum more attenuated than the input signal according to the fundamental frequency $f_0$. The inverse FFT unit 38 performs the inverse FFT process for the output spectrum Y(f) (for example, 512 points) and works out an output signal y(n). Each unit in the functional configuration of the band broadening apparatus 12 is realized by the CPU 21 loading a band broadening program in the RAM 22 and executing the band broadening process.

Figure 12:
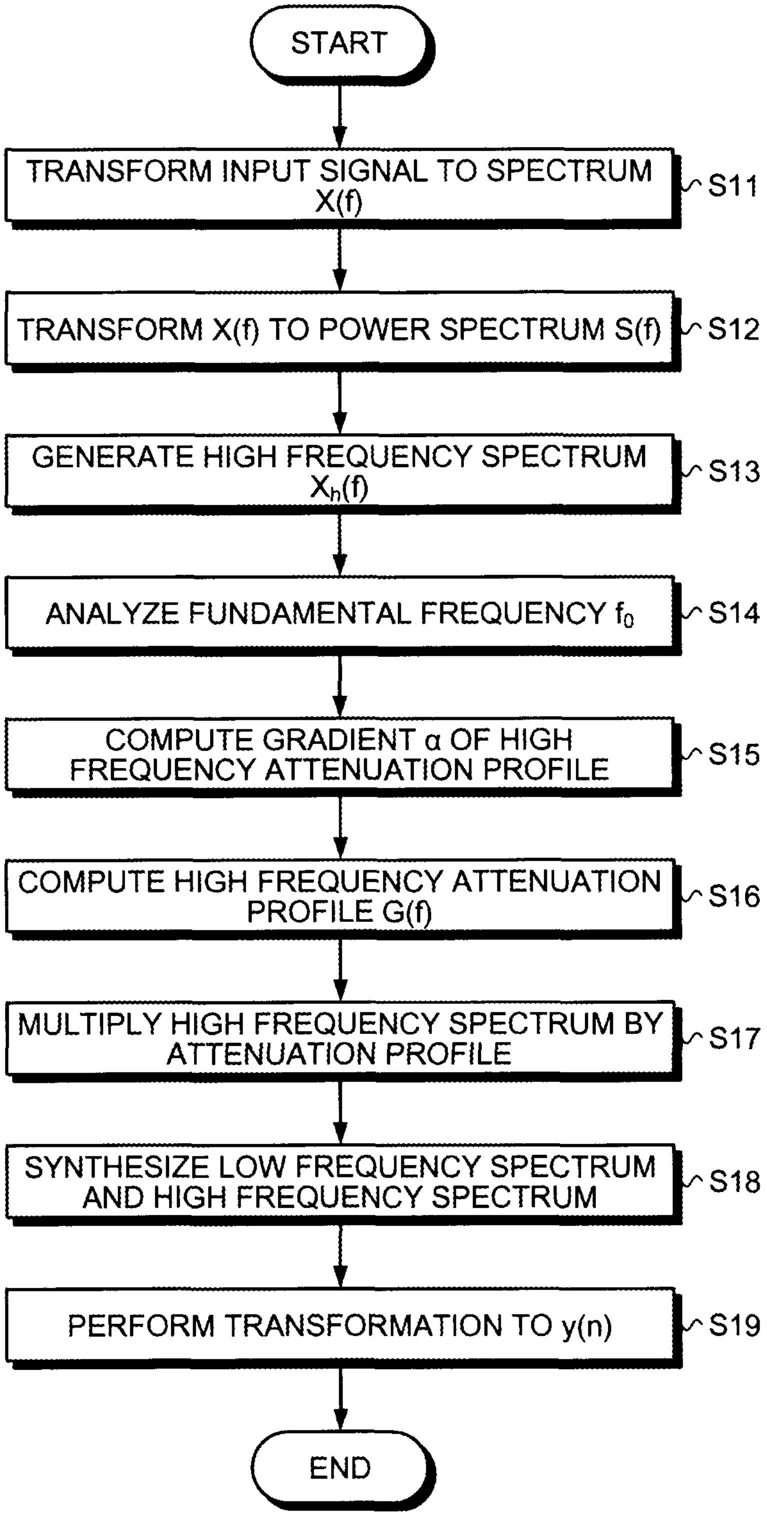
FIG. 12 is a flowchart of a band broadening method according to the second example.

FIG. 12 is a flowchart of the band broadening method according to the second example. As depicted in FIG. 12, when the band broadening process is started, the band broadening apparatus 12 conducts the FFT process for an input signal x(n) by means of the FFT unit 31 and transforms the input signal x(n) into an input spectrum X(f) (step S11). The band broadening apparatus 12 works out a power spectrum S(f) from the input spectrum X(f) based on Equation (1) by means of the power spectrum calculating unit 32 (step S12). The band broadening apparatus 12 generates a high frequency spectrum $X_h(f)$ from the input spectrum X(f) based on Equation (2) by means of the high frequency component generating unit 33 (step S13).

The band broadening apparatus 12 analyzes the fundamental frequency $f_0$ based on the autocorrelation of the power spectrum S(f) according to, for example, Equation (3) by means of the fundamental frequency analyzing unit 34 (step S14). The band broadening apparatus 12 calculates, by means of the frequency response control unit 35, a gradient α of the attenuation profile in the high frequency region corresponding to the fundamental frequency $f_0$ according to, for example, an equation expressed by a graph in FIG. 9 (step S15). The band broadening apparatus 12 conducts the calculation of Equation (4) by means of the frequency response control unit 35 and calculates the attenuation profile G(f) in the high frequency region from the gradient α of the attenuation profile in the high frequency region (step S16).

The band broadening apparatus 12 multiplies, by means of the high frequency component adjusting unit 36, the high frequency spectrum $X_h(f)$ by the attenuation profile G(f) according to Equation (5) and generates the frequency-response-adjusted high frequency spectrum $X_h'(f)$ (step S17). Step S13 may be conducted anytime after step S11 and before step S17.

The band broadening apparatus 12 synthesizes, by means of the spectrum synthesizing unit 37, the input spectrum X(f) (spectrum in low frequency spectrum) and the frequency-response-adjusted high frequency spectrum $X_h'(f)$ and generates the output spectrum Y(f) (step S18). The band broadening apparatus 12 performs the inverse FFT process for the output spectrum Y(f) by means of the inverse FFT unit 38, and transforms the output spectrum Y(f) into the output signal y(n) (step S19) and ends the whole band broadening process.

According to the second example, when the fundamental frequency of an input signal is high, the power difference (volume difference) between the input signal and the high frequency component signal becomes small and thus an approximately ideal broadband sound spectrum as depicted in FIG. 1 is obtained. Further, when the fundamental frequency of the input signal is low, the power difference (volume difference) between the input signal and the high frequency component signal becomes larger and thus an approximately ideal broadband sound spectrum depicted in FIG. 2 is obtained. Accordingly, the high quality sound can be provided.

The third example explains the application of the band broadening apparatus into an audio conferencing apparatus. The application of the band broadening apparatus is not limited to an audio conferencing apparatus but the band broadening apparatus is applicable to an apparatus for the audio communication such as a telephone in the landline telephone system and a cellular phone. In the third example, a high frequency region is generated from a bandlimited input signal, and the high frequency region and the input signal are synthesized to extend the band. The band of the input signal corresponds to the first band and the band of the high frequency component corresponds to the second band.

Units of the audio conferencing apparatus that extend a band of a received audio signal and play sound are similar to the configuration depicted in FIG. 5 and thus a redundant explanation will be omitted.

The hardware configuration of a band broadening apparatus according to the third example is similar to the configuration depicted in FIG. 6 and thus a redundant explanation will be omitted.

Figure 13:
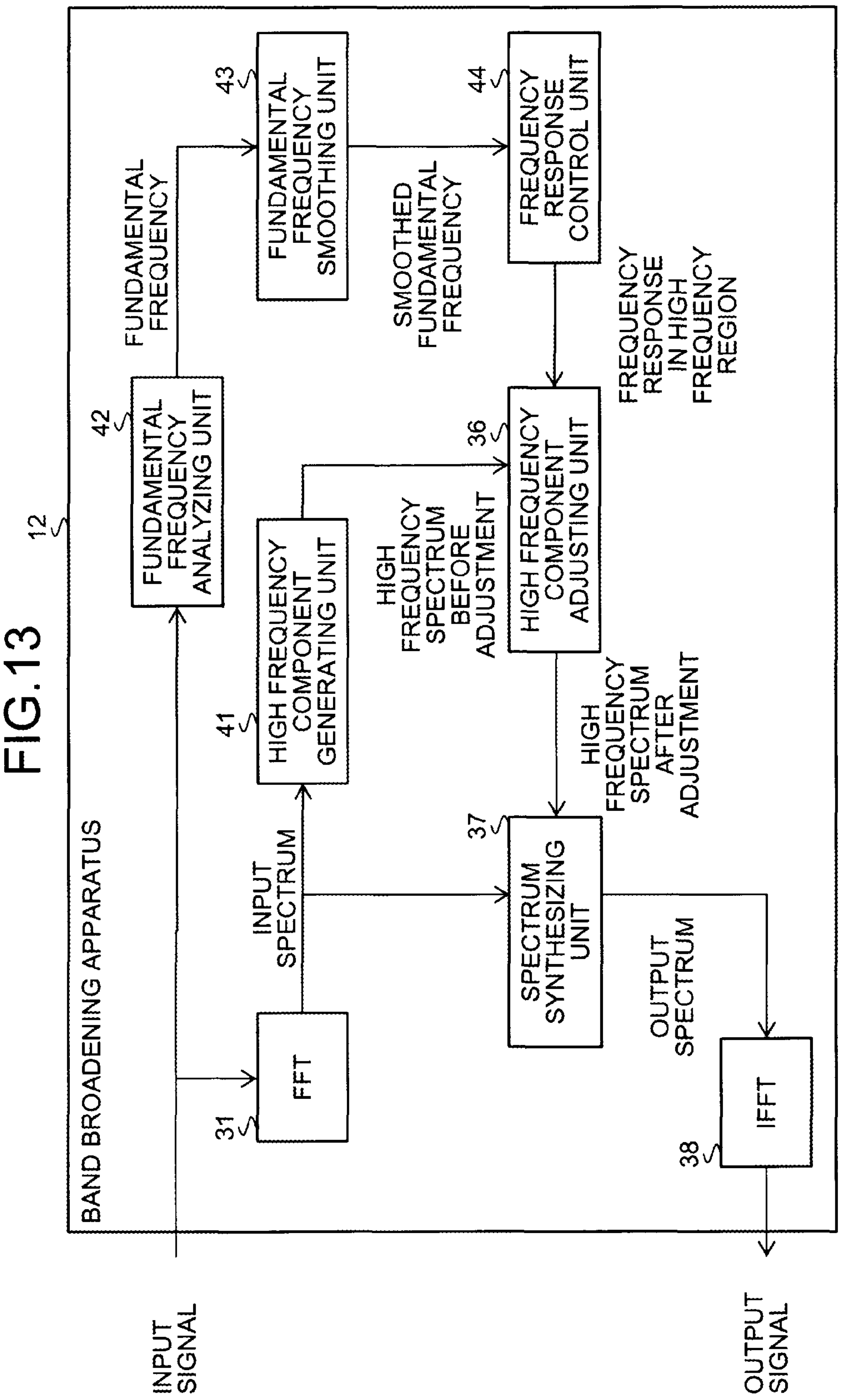
FIG. 13 is a block diagram depicting a functional configuration of the band broadening apparatus according to a third example.

FIG. 13 is a block diagram depicting a functional configuration of the band broadening apparatus according to the third example. Elements identical to that of the second example are given identical reference numerals as in the second example and the explanation thereof will be omitted. As depicted in FIG. 13, the band broadening apparatus 12 includes a high frequency component generating unit 41 serving as the FFT unit 31 and an out-of-band component generating unit. As for the FFT unit 31, see the second example. The high frequency component generating unit 41 folds back the input spectrum X(f) over the frequency number 31 to 127 toward the high frequency region and generates a high frequency spectrum $X_h(f)$ corresponding to the frequency number 128 and the subsequent frequency numbers. At this point, the attenuation profile of the high frequency component is not adjusted.

$$X_h(f+128)=X(127-f)\ f=0 \text{ to } 96 \tag{7}$$

The band broadening apparatus 12 includes a fundamental frequency analyzing unit 42, a fundamental frequency smoothing unit 43, a frequency response control unit 44, the high frequency component adjusting unit 36, the spectrum synthesizing unit 37, and the inverse FFT unit 38. The fundamental frequency analyzing unit 42 works out the fundamental period $t_0$ from the autocorrelation of the input signal x(n) according to Equation (8) below. The fundamental frequency analyzing unit 42 works out the fundamental frequency $f_0$ from the fundamental period $t_0$ according to Equation (9) below.

$$t_0 = \underset{s=8}{\overset{160}{\operatorname{argmax}}}\left(\frac{\sqrt{\sum_{n=0}^{64} x(n)\cdot x(n-s)}}{\sqrt{\sum_{n=0}^{64} x(n)^2}\cdot\sqrt{\sum_{n=0}^{64} x(n+s)^2}}\right) \tag{8}$$

$$f_0 = 1/t_0 \tag{9}$$

Figure 14:
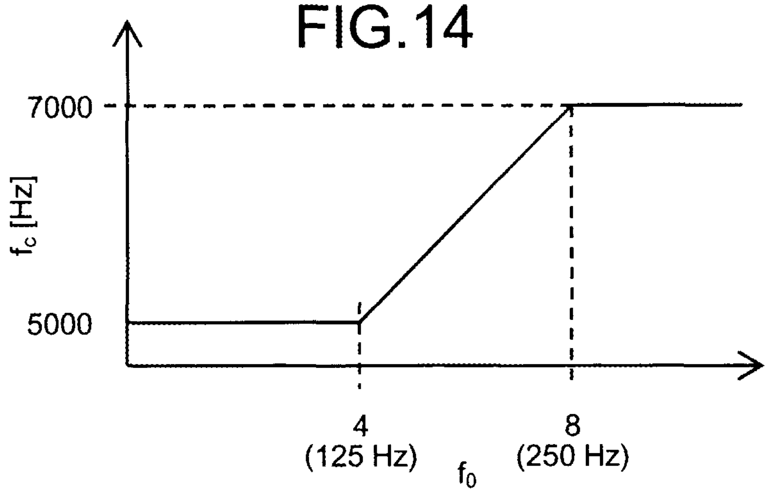
FIG. 14 is a graph expressing an equation for obtaining $f_c$ from $f_0$.

The fundamental frequency smoothing unit 43 works out a cut-off frequency $f_c$ of the high frequency region from the fundamental frequency $f_0$ based on, for example, the graph depicted in FIG. 14. FIG. 14 is a graph expressing an equation for obtaining $f_c$ from $f_0$. In FIG. 14, specific numerical values, frequency numbers 4 and 8, and frequencies 125 Hz and 250 Hz, are one example as explained in the second example.

According to FIG. 14, when the fundamental frequency $f_0$ is less than the frequency number 4, $f_c$ is at a constant value of 5000 Hz. As the fundamental frequency $f_0$ moves from the frequency numbers 4 and 8, $f_c$ goes to 7000 Hz at a constant gradient. When the fundamental frequency $f_0$ is more than the frequency number 8, $f_c$ is at a constant value of 7000 Hz. Specific values on the vertical and horizontal axes in FIG. 14 have been given as an example.

Figure 15:
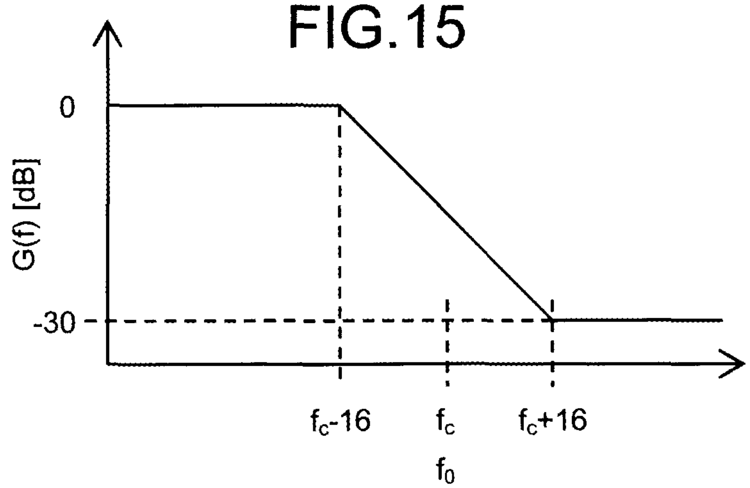
FIG. 15 is a graph expressing an equation for obtaining G(f) from $f_c$.

The frequency response control unit 44 works out the attenuation profile G(f) of the high frequency region from the cut-off frequency $f_c$ according to, for example, the graph depicted in FIG. 15. FIG. 15 is a graph expressing an equation for obtaining G(f) from $f_c$.

According to FIG. 15, when the fundamental frequency $f_0$ is less than $f_c-16$, G(f) is constant value taking 0 dB. When the fundamental frequency $f_0$ moves from $f_c-16$ to $f_c+16$, G(f) goes to −30 dB at a constant gradient. When the fundamental frequency $f_0$ is more than $f_c+16$, G(f) is constant taking −30 dB. Specific values on the vertical and horizontal axes in FIG. 15 have been given as an example. The cut-off frequency $f_0$ of the high frequency region fluctuates in a range between 5000 Hz and 7000 Hz in FIG. 14.

As for the high frequency component adjusting unit 36, the spectrum synthesizing unit 37, and the inverse FFT unit 38, see the second example. Each functional element of the band broadening apparatus 12 is realized by the CPU 21 loading the band broadening program to the RAM 22 and executing the band broadening process.

Figure 16:
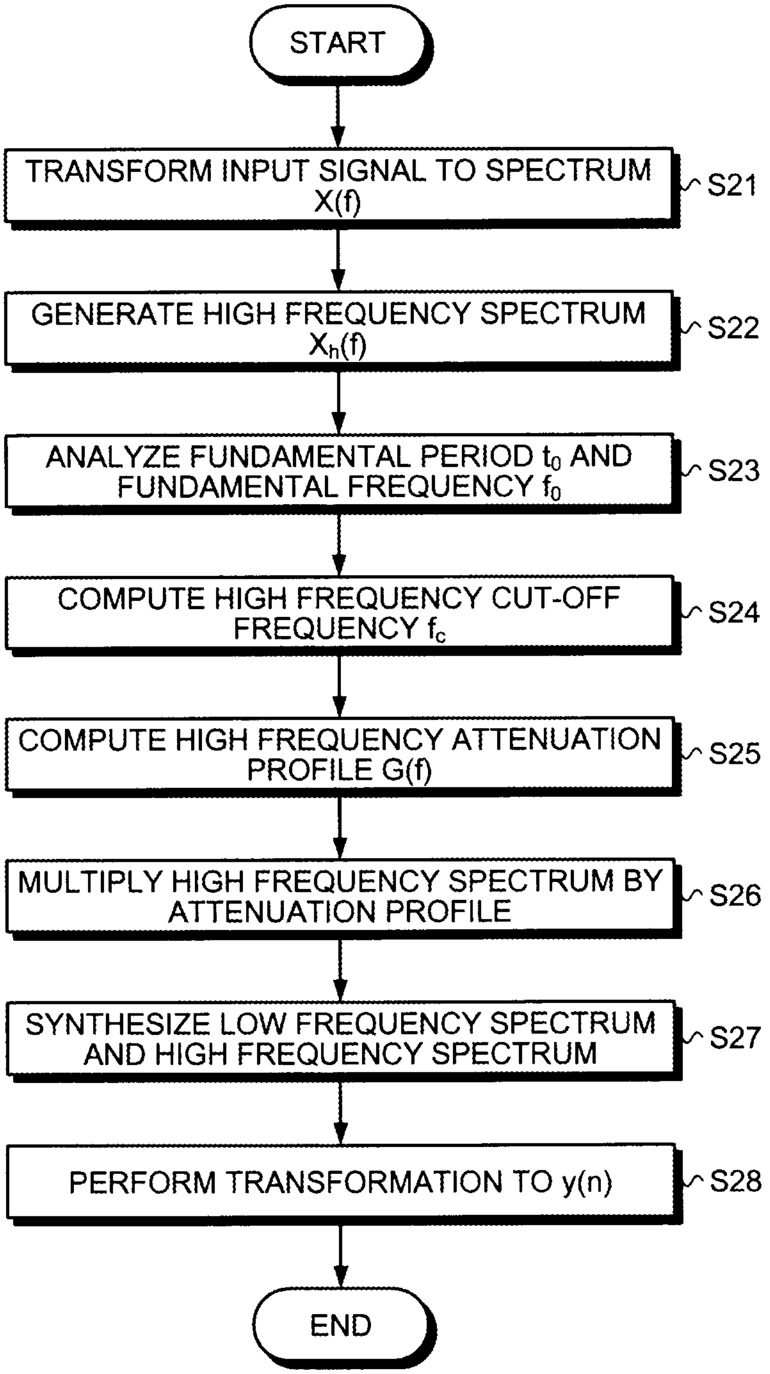
FIG. 16 is a flowchart of the band broadening method according to the third example.

FIG. 16 is a flowchart of the band broadening method according to the third example. When the band broadening process is started, the band broadening apparatus 12 performs the FFT process for the input signal x(n) by means of the FFT unit 31 transforming the input signal x(n) to the input spectrum X(f) (step S21). The band broadening apparatus 12 generates the high frequency spectrum $X_h(f)$ from the input spectrum X(f) by means of the high frequency component generating unit 41 according to Equation (7) (step S22).

The band broadening apparatus 12 performs the calculation of Equations (8) and (9) by means of the fundamental frequency analyzing unit 42 and analyzes the fundamental period $t_0$ and the fundamental frequency $f_0$ (step S23). The band broadening apparatus 12 works out, by means of the fundamental frequency smoothing unit 43, the cut-off frequency $f_c$ of the high frequency region from the fundamental frequency $f_0$ based on the graph depicted in FIG. 14 (step S24). The band broadening apparatus 12 works out, by means of the frequency response control unit 44, the attenuation profile G(f) of the high frequency region from the cut-off frequency $f_c$ based on the graph depicted in FIG. 15 (step S25).

The subsequent steps are identical to steps S17 to S19 of the second example (step S26 to step S28) and the whole process ends. Step S22 may be performed anytime after step S21 and before step S26. The third example presents a similar advantage as the second example.

The fourth example explains the application of the band broadening apparatus into a cellular phone, generating a low frequency component from a bandlimited input signal and synthesizing the low frequency component and the input signal to extend a band. The application of the band broadening apparatus is not limited to a cellular phone but the band broadening apparatus is applicable to an apparatus for an audio communication. The band of the input signal corresponds to the first band and the band of the low frequency component corresponds to the second band.

Units of the cellular phone that extend a band of a received audio signal and play sound are similar to the configuration depicted in FIG. 5 and thus a redundant explanation will be omitted. In the fourth example, the band broadening apparatus 12 extends a band of the output signal from the decoder 11 and outputs a signal with an 8-kHz bandwidth.

The hardware configuration of a band broadening apparatus according to the fourth example is similar to the configuration depicted in FIG. 6 and thus a redundant explanation will be omitted.

Figure 17:
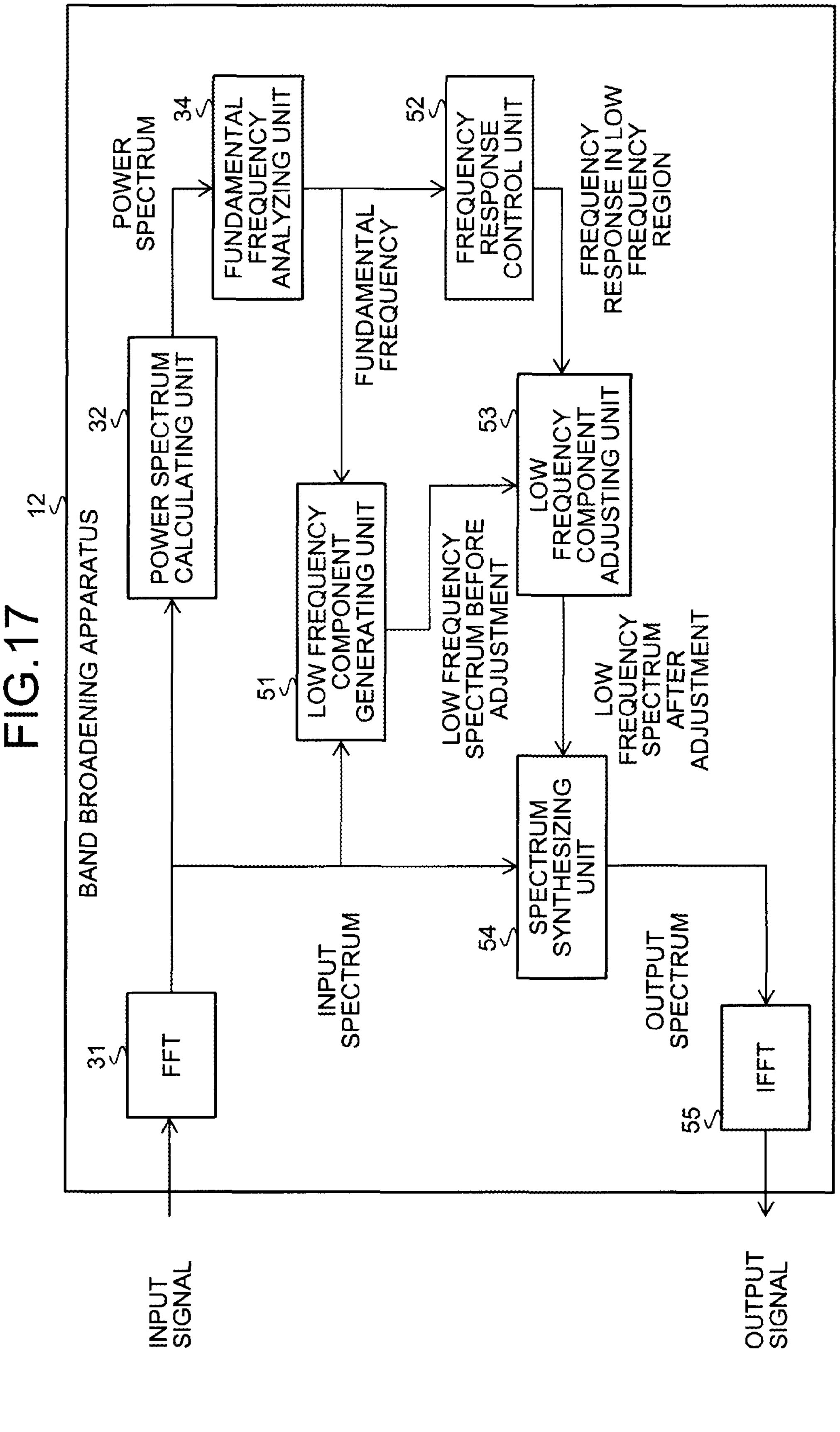
FIG. 17 is a block diagram depicting a functional configuration of the band broadening apparatus according to a fourth example.

FIG. 17 is a block diagram depicting a functional configuration of the band broadening apparatus according to the fourth example. Elements identical to those of the second example are given identical reference numerals as in the second example and the explanation thereof will be omitted. The band broadening apparatus 12 includes the FFT unit 31, the power spectrum calculating unit 32, and the fundamental frequency analyzing unit 34. See the second example for the detail of the FFT unit 31, the power spectrum calculating unit 32, and the fundamental frequency analyzing unit 34.

The band broadening apparatus 12 includes a low frequency component generating unit 51 and a frequency response control unit 52 that serve as an out-of-band component generating unit, and a low frequency component adjusting unit 53 that serves as a out-of-band component adjusting unit. The low frequency component generating unit 51 shifts toward the low frequency region the input spectrum X(f) ranging from the frequency number corresponding to the fundamental frequency $f_0$ to the frequency number corresponding to three times of $f_0$ and generates the low frequency spectrum $X_L(f)$ ranging from the frequency number 0 to the frequency number corresponding to twice of $f_0$. At this point, the attenuation profile of the low frequency component is not adjusted.

$$X_L(f)=X(f+f_0)\ f=0\text{ to }2\cdot f_0 \quad (10)$$

Figure 18:
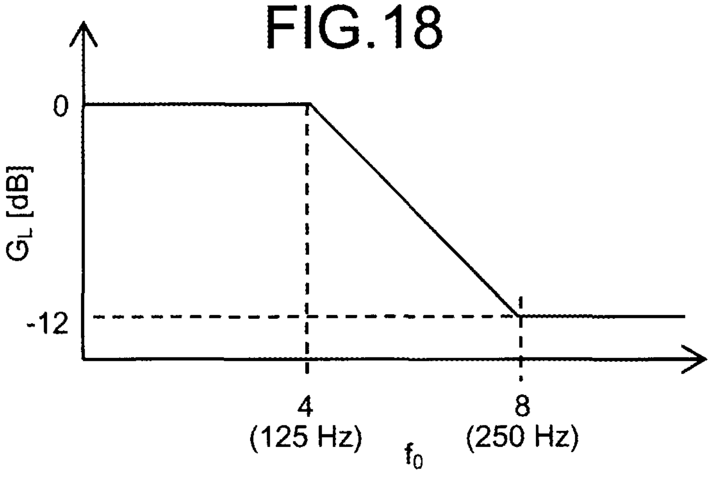
FIG. 18 is a graph expressing an equation for obtaining $G_L$ from $f_0$.

The frequency response control unit 52 works out a target amount of attenuation $G_L$ in the low frequency region from the fundamental frequency $f_0$ based on a graph depicted in FIG. 18. FIG. 18 is a graph expressing an equation for obtaining $G_L$ from $f_0$. The specific numerical values, frequency numbers 4 and 8 and frequencies 125 Hz and 250 Hz, are mere examples as explained in the second example.

In FIG. 18, when the fundamental frequency $f_0$ is less than the frequency number 4, $G_L$ is constant at 0 dB. When the fundamental frequency $f_0$ moves from the frequency number 4 to the frequency number 8, $G_L$ goes to −12 dB. When the fundamental frequency $f_0$ is more than the frequency number 8, $G_L$ is constant at −12 dB. The specific values on the vertical and horizontal axes in FIG. 18 have been given as an example.

Figure 19:
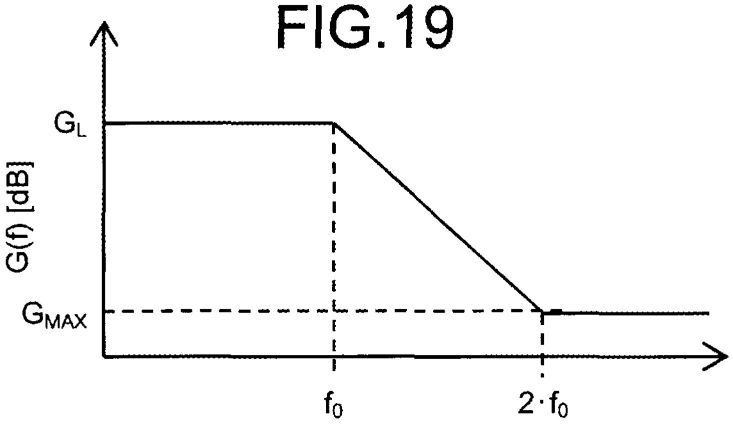
FIG. 19 is a graph expressing an equation for obtaining G(f) based on $G_L$.

The frequency response control unit 52 calculates the attenuation profile G(f) of the low frequency region based on the target amount $G_L$ and the graph depicted in FIG. 19. FIG. 19 is a graph expressing an equation for obtaining G(f) based on $G_L$. In FIG. 19, when the frequency is less the fundamental frequency $f_0$, G(f) is constant at $G_L$. When the frequency moves from $f_0$ to twice of $f_0$, G(f) goes to −60 dB, maximum $G_{MAX}$, at a constant gradient. When the frequency is more than twice the fundamental frequency $f_0$, G(f) is constant at maximum $G_{MAX}$. Specific values on the horizontal axis in FIG. 19 have been given as an example.

The low frequency component adjusting unit 53 multiples, as taught by Equation (11) below, the low frequency spectrum $X_L(f)$ generated by the low frequency component generating unit 51 by the attenuation profile G(f) of the low frequency region controlled by the frequency response control unit 52 and generates the frequency-response-adjusted low frequency spectrum $X_L'$.

$$X_L'(f)=X_L(f)\cdot G(f) \quad (11)$$

The band broadening apparatus 12 further includes a spectrum synthesizing unit 54 and an inverse FFT unit 55. The spectrum synthesizing unit 54 synthesizes the input spectrum X(f) output from the FFT unit 31 and the frequency-response-adjusted low frequency spectrum $X_L'(f)$ output from the low frequency component adjusting unit 53 and generates the output spectrum Y(f) according to Equation (12) below.

$$Y(f)=X(f)+X_L'(f)\ f=0 \text{ to } 127 \quad (12)$$

The inverse FFT unit 55 performs the inverse FFT process (for example 256 points) for the output spectrum Y(f) and works out the output signal y(n). Each element in the functional configuration of the band broadening apparatus 12 is realized by the CPU 21 loading the band broadening program to the RAM 22 and executing the band broadening process.

Figure 20:
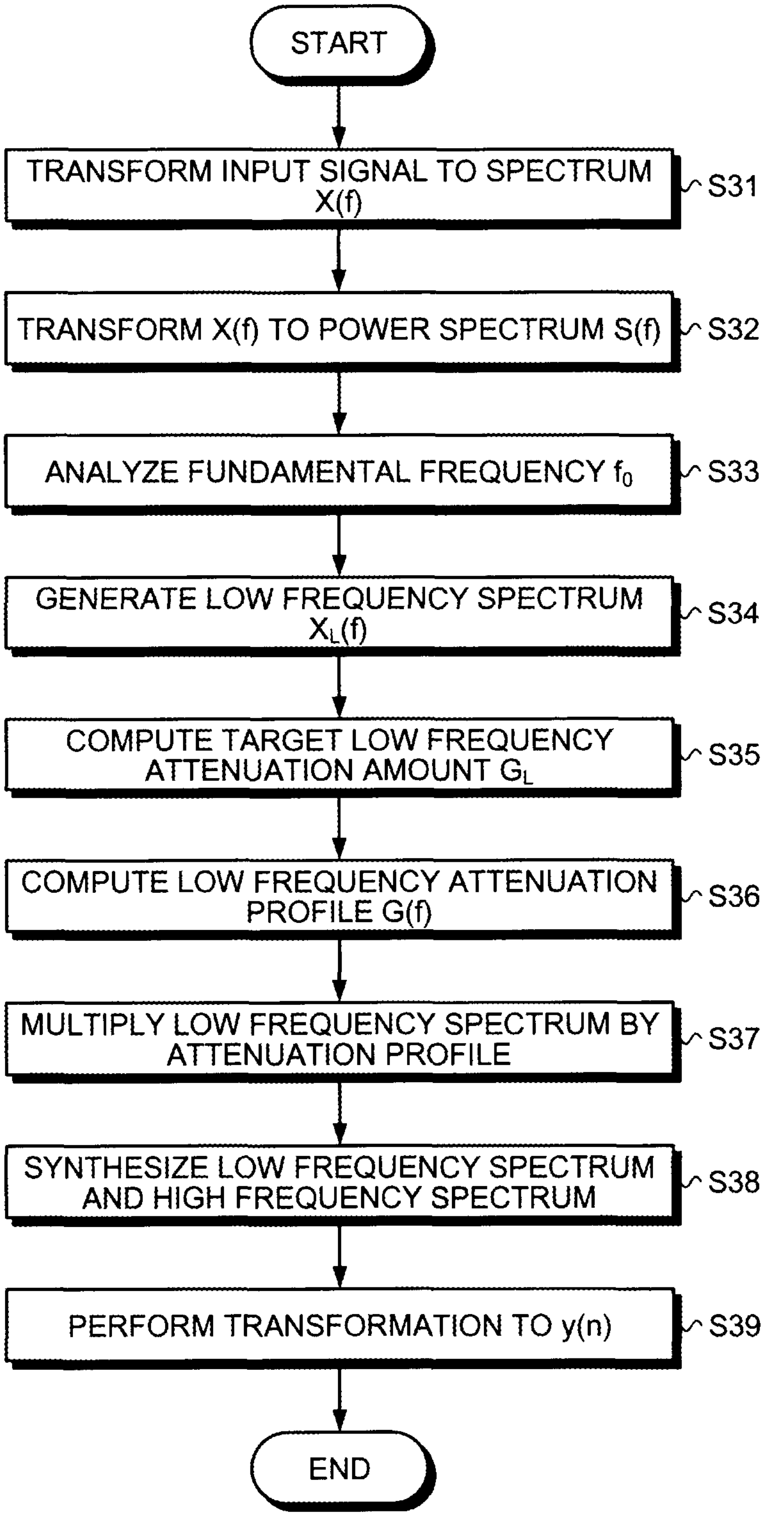
FIG. 20 is a flowchart of the band broadening method according to the fourth example.

FIG. 20 is a flowchart of the band broadening method according to the fourth example. When the band broadening process is started, the band broadening apparatus 12 transforms the input signal x(n) into the input spectrum X(f) in a similar manner as step Sll of the second example (step S31). The band broadening apparatus 12 transforms the input spectrum X(f) to the power spectrum S(f) in a similar manner as step S12 of the second example (step S32). The band broadening apparatus 12 analyzes the fundamental frequency $f_0$ based on the power spectrum S(f) in a similar manner as step S14 of the second example (step S33).

The band broadening apparatus 12 generates the low frequency spectrum $X_L(f)$ from the input spectrum X(f) and the fundamental $f_0$ according to Equation (10) by means of the low frequency component generating unit 51 (step S34). The band broadening apparatus 12 works out the target amount of attenuation $G_L$ from the fundamental frequency $f_0$ based on the graph depicted in FIG. 18 by means of the frequency response control unit 52 (step S35). The band broadening apparatus 12 works out, by means of the frequency response control unit 52, the attenuation profile G(f) of the low frequency region based on $G_L$ according to the graph depicted in FIG. 19 (step S36). Step S34 may be conducted anytime before step S33 and before step S37.

The band broadening apparatus 12 multiplies the low frequency spectrum $X_L(f)$ by the attenuation profile G(f) of the low frequency region according to Equation (11) by means of the low frequency component adjusting unit 53 and generates the frequency-response-adjusted low frequency spectrum $X_L'(f)$ (step S37). The band broadening apparatus 12 synthesizes, by means of the spectrum synthesizing unit 54, the input spectrum X(f), the spectrum of the high frequency region and the frequency-response-adjusted low frequency spectrum $X_L'(f)$ according to Equation (12) and generates the output spectrum Y(f) (step S38). The band broadening apparatus 12 performs the inverse FFT process for the output spectrum Y(f) by means of the inverse FFT unit 55 and transforms the output spectrum Y(f) to the output signal y(n) (step S39) and the whole process ends. According to the fourth embodiment, the extension of a band toward the low frequency region also presents the advantages similar to the second example.

According to one aspect of the invention, high quality sound can be output.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A band broadening apparatus comprising a processor in communication with a memory, wherein the memory contains programmed instructions which when executed by the processor perform the following steps:

analyze a fundamental frequency based on an input speech signal bandlimited to a first band, generate a second speech signal that includes a second band different from and bandbroadened from the first band based on the input speech signal, control a frequency response of the second band based on the fundamental frequency, reflect the frequency response of the second band on the second speech signal that includes the second band and generate a frequency-response-adjusted speech signal that includes the second band, and synthesize the input speech signal and the frequency-response-adjusted signal, wherein the processor controls sound power of the frequency response of the second band such that more attenuation is given when the fundamental frequency of the bandlimited first band is high and that less attenuation is given when the fundamental frequency of the bandlimited first band is low.

2. The band broadening apparatus according to claim 1, wherein the sound power of the second band is at most 0 dB.

3. The band broadening apparatus according to claim 1, wherein an amount of the amplification at the boundary between the first band and the second band is 0 dB.

4. The band broadening apparatus according to claim 1, wherein the frequency response of the second band is a function proportional to a frequency.

5. A band broadening method comprising:

analyzing, using a processor, a fundamental frequency based on an input speech signal bandlimited to a first band;

generating, using the processor, a second speech signal that includes a second band different from and broadened from the first band based on the input speech signal;

controlling, using the processor, sound power of a frequency response of the second band based on the fundamental frequency of the bandlimited first band such that more attenuation is given when the fundamental frequency of the bandlimited first band is high and that less attenuation is given when the fundamental frequency of the bandlimited first band is low;

reflecting, using the processor, the frequency response of the second band on the second speech signal that includes the second band and generate a frequency-response-adjusted speech signal that includes the second band; and synthesizing, using the processor, the input speech signal and the frequency-response-adjusted signal.

6. The band broadening method according to claim 5, wherein the sound power of the second band is at most 0 dB.

7. The band broadening method according to claim 5, wherein an amount of the amplification at the boundary between the first band and the second band is 0 dB.

8. The band broadening method according to claim 5, wherein the frequency response of the second band is a function proportional to a frequency.

* * * * *